(12) United States Patent
Nielsen et al.

(10) Patent No.: US 10,288,705 B2
(45) Date of Patent: May 14, 2019

(54) CORRECTED MULTIPLE-SLICE MAGNETIC RESONANCE IMAGING

(71) Applicant: KONINKLIJKE PHILIPS N.V., Eindhoven (NL)

(72) Inventors: Tim Nielsen, Eindhoven (NL); Peter Boernert, Jr., Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 202 days.

(21) Appl. No.: 15/027,283

(22) PCT Filed: Sep. 25, 2014

(86) PCT No.: PCT/EP2014/070425
§ 371 (c)(1),
(2) Date: Apr. 5, 2016

(87) PCT Pub. No.: WO2015/052002
PCT Pub. Date: Apr. 16, 2015

(65) Prior Publication Data
US 2016/0252596 A1 Sep. 1, 2016

(30) Foreign Application Priority Data

Oct. 8, 2013 (EP) .................................... 13187655

(51) Int. Cl.
*G01R 33/48* (2006.01)
*G01R 33/483* (2006.01)
(Continued)

(52) U.S. Cl.
CPC ....... *G01R 33/4835* (2013.01); *G01R 33/482* (2013.01); *G01R 33/5617* (2013.01); *G01R 33/56509* (2013.01); *G01R 33/4824* (2013.01)

(58) Field of Classification Search
CPC ........ G01R 33/48; G01R 33/50; G01R 33/54; G01R 33/543; G01R 33/561;
(Continued)

(56) References Cited

U.S. PATENT DOCUMENTS

| 5,323,110 A | 6/1994 | Fielden |
| 7,030,609 B2 | 4/2006 | Pipe |

(Continued)

FOREIGN PATENT DOCUMENTS

| WO | 2008132659 A2 | 11/2008 |
| WO | 2012160486 A2 | 11/2012 |
| WO | 2013144791 A1 | 10/2013 |

OTHER PUBLICATIONS

Ge et al "Free-Breathing Myocardial Perfusion MRI Using SW-CG-Hypr and Motion Correction" MRM 64 (2010) p. 1148-1154.
(Continued)

*Primary Examiner* — Son T Le (57) ABSTRACT

A magnetic resonance imaging system (100) acquires magnetic resonance data (142, 148, 158) with a pulse sequence (140) for multiple slice acquisition performed over multiple repetition cycles. The magnetic resonance imaging system includes a processor (540) configured to: acquire (200) a first slice group (142) of the magnetic resonance data during a first repetition cycle; extract (202) first central k-space data (144) from the first slice group; reconstruct (204) first navigator data (146) using the first central k-space data. The processor is further configured to repeatedly: acquire (206) a subsequent slice group (148) of the magnetic resonance data during a subsequent repetition cycle; extract (208) subsequent central k-space data (150) from the subsequent slice group; reconstruct (210) subsequent navigator data (152) using the subsequent central k-space data; determine (212) a mapping (154) from the first navigator data to the
(Continued)

subsequent navigator data; and correct (214) the acquisition of a next slice group of the magnetic resonance data using the mapping.

18 Claims, 4 Drawing Sheets

(51) Int. Cl.
*G01R 33/561* (2006.01)
*G01R 33/565* (2006.01)

(58) Field of Classification Search
CPC ............ G01R 33/5612; G01R 33/5613; G01R 33/5616; G01R 33/5617; G01R 33/5614; G01R 33/565; G01R 33/56509; G01R 33/482; G01R 33/4824; G01R 33/4828; G01R 33/483; G01R 33/4835
See application file for complete search history.

(56) References Cited

U.S. PATENT DOCUMENTS

| | | |
|---|---|---|
| 7,176,684 B2 | 2/2007 | Patch et al. |
| 2001/0005135 A1 | 6/2001 | Thesen |
| 2012/0243753 A1 | 9/2012 | Soenksen |
| 2012/0243756 A1 | 9/2012 | Samsonov |

OTHER PUBLICATIONS

Pipe J.G. "Periodically Rotated Overlapping Parallel Lines With Enhanced Reconstruction MRI . . . " International Society for Magnetic Resonance in Med. May 22, 1999.

Huan et al "3D Grase Propeller Improved Image Acquistion Technique for Arterial Spin Labeling . . . " Magnetic Resonance in Medicine vol. 66, No. 1 Jan. 19, 2011 p. 168-173.

Pipe J.G. "Motion Correction With Propeller MRI: Appliction to Head Motion and Free-Breathing Cardiac Imaging" Magnetic Resonance in Med. 42 p. 963-969.

Schaffter et al "Motion Compensated Projection Reconstruction" Magnetic Resonance in Medicine vol. 41 p. 954-963 (1999).

CORRECTED MULTIPLE-SLICE MAGNETIC RESONANCE IMAGING

CROSS REFERENCE TO RELATED APPLICATIONS

This application is a U.S. national phase application of International Application No. PCT/EP2014/070425, filed on Sep. 25, 2014, which claims the benefit of EP Application Serial No. 13187655.9 filed on Oct. 8, 2013 and is incorporated herein by reference.

TECHNICAL FIELD

The invention relates to magnetic resonance imaging, in particular to the correction of the acquisition during multi-slice acquisitions.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used. The transmitted RF field is referred to as the B1 field.

MRI scanners are able to construct images of either slices or volumes. A slice is a thin volume that is only one voxel thick. A voxel is a small volume over which the MRI signal is averaged, and represents the resolution of the MRI image. A voxel may also be referred to as a pixel herein.

International patent application publication WO 2008/132659 A2 discloses a magnetic resonance device in which the device acquires a plurality of k-space blades according to the PROPELLER scheme. The device is arranged to weight the acquired MR data, wherein weighting factors are computed on the basis of acquisition times for contrast manipulation, correlation measure for motion compensation, and on the basis of the geometry of the overlapping areas of the k-space blades. The paper 'Free-breathing myocardial perfusion MRI using SW-CG-HYPR and motion correction' by L. Ge et al in MRM64(2010)1148-1154 discloses an ECG triggered multi-slice gradient echo sequence with radial k-space sampling. From six slices following three saturation recovery preparations in each cardiac cycle a composite image is reconstructed. Low-resolution images reconstructed from the center of k-space from each cardiac cycle are compared to the composite image. From this comparison translation and rotation of the heart are detected in the image domain.

SUMMARY OF THE INVENTION

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems.

The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system for acquiring magnetic resonance data from a subject within an imaging zone. The magnetic resonance imaging system comprises a memory for storing machine-executable instructions and also for storing a pulse sequence. The pulse sequence may be stored in the form of pulse sequence data. Pulse sequence data as used herein encompasses data which is descriptive of a pulse sequence and enables the processor to acquire magnetic resonance data using the method specified by the pulse sequence. The pulse sequence comprises instructions for controlling the magnetic resonance imaging system to acquire magnetic resonance data. The pulse sequence controls the magnetic resonance imaging system to acquire the magnetic resonance data as a multiple slice acquisition performed over multiple repetition cycles. A pulse sequence as used herein comprises either instructions or a data structure which may be converted into instructions for controlling the acquisition of data or magnetic resonance data by a magnetic resonance imaging system. The pulse sequence controls the method by which the magnetic resonance imaging system acquires the magnetic resonance data. The magnetic resonance imaging system further comprises a processor for controlling the magnetic resonance imaging system.

Execution of the machine-executable instructions causes the processor to acquire a first slice group of the magnetic resonance data during a first repetition cycle using the pulse sequence. The magnetic resonance data when complete is made up from multiple slices. A slice group as used herein encompasses one or more slices of the magnetic resonance data. Execution of the instructions further causes the processor to extract first central k-space data from the first slice group. The magnetic resonance data is acquired in k-space. Execution of the instructions further causes the processor to reconstruct first navigator data using the first central k-space data.

Navigator data as used herein is data which enables the monitoring of a position of the subject or a change in the position of the subject. The navigator data may for instance be data which is in k-space. This is because the motion of the subject in real space will cause motion in k-space also. The first navigator data could also be constructed by taking the central k-space data and reconstructing an image from the first central k-space data. In this case the first navigator data could be an image or images or even a 3D model that was reconstructed from the first central k-space data. Execution of the instructions causes the processor to repeatedly acquire a subsequent slice group of the magnetic resonance data during a subsequent repetition cycle using the pulse sequence.

Execution of the instructions further causes the processor to repeatedly extract subsequent central k-space data from the subsequent slice group. Execution of the instructions further cause the processor to repeatedly determine a mapping from the first navigator data to the subsequent navigator data by performing a transformation between the first navigator data and the subsequent navigator data. A mapping as used herein encompasses a mathematical description of a set of transformation of one set of coordinates to another set of coordinates. For a rigid body transformation a mapping may be a translation and/or rotations. A mapping may also refer to a deformable mapping where a volume is transformed into another volume.

The way the mapping is calculated would depend upon what type of navigator data the first navigator and the subsequent navigator data are. For instance, if they are both k-space data then a calculation would be performed to determine the mapping. If the first navigator data and the subsequent navigator data are images or a 3D model then a transformation or a deformable body transformation model may be used to determine the mapping. The mapping is a measure of how much the subject has moved in between when the data for reconstructing the first navigator data was made and when the subsequent navigator data was. Execution of the instructions further cause the processor to correct the acquisition of a next slice group of the magnetic resonance data using the mapping. The mapping is a measure of how much the subject has moved during the acquisition. This knowledge of how the subject has moved can be used to prospectively correct the acquisition of the magnetic resonance data. For instance by changing the gradient fields used in the pulse sequence to correct for the motion of the subject or change in position.

In some examples the mapping could be a rigid body transformation.

In another embodiment the magnetic resonance data comprises multiple slices. The correction of the acquisition of the next slice group of the magnetic resonance data with the mapping corrects for in-plane rigid body motion of the subject within each of the multiple slices and for through-plane rigid body motion between the multiple slices. The multiple slices are typically acquired as parallel planes. Because the first and subsequent navigator data are constructed from the central k-space data there is some overlap in the acquired data. The exact same k-space points may not be sampled; however, k-space data points that are sampled from a central region are however related to each other. This redundancy enables the correction for the through-plane rigid body motion.

In another embodiment execution of the instructions further causes the processor to calculate scan parameter adjustments using the mapping. The correction of the acquisition of the next slice group of the magnetic resonance data using the mapping is at least partially performed by modifying the acquisition of the next slice group of the magnetic resonance data with the scan parameter adjustments. The scan parameter adjustments may be instance specify a slightly different location in space of the next slice group. As the subject moves externally or internally this embodiment may enable the correction of the location of the next slice group to correct for the subject motion.

In another embodiment execution of the instructions further cause the processor to determine if the mapping has a transformation above a predetermined deletion threshold. The correction of the acquisition of the next slice group of the magnetic resonance data using the rigid body transformation or mapping is at least partially performed by deleting the subsequent slice group of the magnetic resonance data from the magnetic resonance data. In this embodiment if the subject moves more than a predetermined amount then the magnetic resonance imaging system is able to compensate by using the mapping to correct the location from which the next or subsequent slice is acquired.

The mapping may take several forms, for instance if it is assumed that there is a rigid body then the mapping may include a translation and/or rotation. For a deformable body this may be again a translation and a rotation but may also include a deformation of the subject (i.e., shearing and/or scaling).

In another embodiment execution of the instructions further cause the processor to determine if the mapping has a transformation above a predetermined re-acquisition threshold. The correction of the acquisition of the next slice group of the magnetic resonance data using the rigid body transformation is at least partially performed by re-acquiring the subsequent slice group of the magnetic resonance data. In this embodiment if the mapping shows that during the acquisition of a particular slice or slice group that the subject has moved more than the predetermined re-acquisition threshold then either that particular slice or slice group is then re-acquired.

In another embodiment the pulse sequence is operable to cause the magnetic resonance imaging system to acquire the magnetic resonance data without a gap between the multiple slices. A slice as used herein presents a three-dimensional volume in space from which magnetic resonance data is acquired. Slices are usually slab-like. Slices may be acquired such that they are adjacent to and border each other or they may be acquired in such a way that they only pass through a few planes in the subject. In this embodiment the slabs are acquired such that they are adjacent to each other.

This embodiment is advantageous because there is continuous magnetic resonance data. For this reason magnetic resonance data that is acquired after the subject is moving or has moved may still be useful. For instance the position in k-space of particular k-space points may be corrected. Execution of the instructions further causes the processor to reconstruct a magnetic resonance image using the magnetic resonance data and the rigid body transformation by iteratively correcting the location of the subsequent slice group of the magnetic resonance data. So in this embodiment the actual position in space of the slice group is corrected. This is done iteratively by using the mapping to estimate the amount that points must be shifted. The location of the k-space data can be shifted slightly and then an image can be reconstructed. By examining the image it can be seen whether the k-space data is in the right position or not. Without a gap it may also be described as continuous with reference to the magnetic resonance data.

In another embodiment the first navigator data is a first three-dimensional navigator in image space. The subsequent navigator data is a subsequent three-dimensional navigator in image space. The central k-space of both navigators was reconstructed into a three-dimensional navigator in both cases. This embodiment may be beneficial because standard image processing techniques may be used to calculate the mapping. Preferably, a three-dimensional transformation is performed between the first navigator data and the subsequent navigator data. As three-dimensional information is available from the navigators, both through-plane and in-plane corrections are made prospectively.

In another embodiment the mapping is any one of the following: a rigid boy translation, a deformable body transformation, a rigid body transformation for a region of interest, a rigid body transformation for the region of interest with a deformable body transformation for a surrounding region. All of these may be performed using known image processing techniques. Reducing the navigator data to a region of interest may be beneficial because the region of interest can be centered or located on a particular or anatomical landmark of the subject. This may result in more close alignment of the slice groups acquired at different times with particular portions of the subject's anatomy.

In another embodiment the magnetic resonance imaging system comprises a multi-element radio-frequency coil for acquiring magnetic resonance data. The pulse sequence is a parallel imaging technique. Execution of the instructions further cause the processor to receive a set of coil sensitivities for the multi-element radio-frequency coil. This may be a set of coil sensitivities which were measured previously or they may be received by taking some reference measurements. Execution of the instructions further causes the processor to unfold the first three-dimensional navigator image using the set of coil sensitivities. Execution of the instructions further causes the processor to unfold the subsequent three-dimensional navigator image using the set of coil sensitivities. In the magnetic resonance data acquired from different antenna elements of the multi-element radio-frequency coil a more accurate k-space data may be constructed.

In another embodiment the first central k-space data and the subsequent central k-space data are selected such that the Nyquist sampling criterion is satisfied.

In another embodiment execution of the instructions further cause the processor to calculate a first two-dimensional image by slicing the first three-dimensional navigator image along a first plane. Execution of the instructions further causes the processor to calculate a subsequent two-dimensional image by slicing the subsequent three-dimensional navigator image along a second place. The location of the second plane is determined by applying the rigid body transformation to the first plane. Execution of the instructions further causes the processor to calculate and in-plane deformable body transformation between the first two-dimensional image and the subsequent two-dimensional image.

Execution of the instructions further cause the processor to re-acquire or delete a slice portion of the subsequent slice group of the magnetic resonance data if the deformable body transformation indicates motion of the subject beyond a predetermined amount. In this embodiment particular slices may be examined for in-plane movement. Both of the three-dimensional navigators are sliced in the same location. This ensured by applying the mapping to the first plane. The rigid body transformation is determined between the two three-dimensional navigators and then later two-dimensional images are compared between the two to detect deformable translations within the subject. This may be useful in a variety of situations. For one case rigid portions of the subject's anatomy may be used for the rigid body transformation and then later movement of the soft tissues within the subject can be examined by putting the in-plane deformable body transformations between different slices or portions of the three-dimensional navigators.

In another embodiment the first navigator data is a first k-space navigator. The second navigator data is a second k-space navigator. In some cases it may be beneficial to use the k-space data directly to determine the mapping.

In another embodiment the pulse sequence comprises commands for performing any one of the following magnetic resonance imaging techniques: PROPELLER, radial Turbo Spin Echo, selected spiral Turbo Spin Echo, and Turbo Field Echo. These are examples of magnetic resonance imaging techniques which may benefit from the determining a mapping to correct the acquisition of the next slice group.

In another embodiment execution of the instructions cause the processor to replace the first navigator data with the subsequent navigator data after determining the mapping. That is to say instead of always looking at the navigator data that was acquired as a reference the mapping between the first navigator data and the second navigator data is done by comparing data from slice groups that are acquired sequentially. The mappings that are acquired in this manner may be used in different ways. For instance the motion may be tracked only to adjacent sequentially acquired slice groups, the mapping may also be in some instances determined cumulatively, for instance if it is a rigid body transformation the transformations could be combined to determine a cumulative mapping. This may enable more complicated or complex methods of correcting the acquisition.

In another aspect the invention provides for a computer program product comprising machine-executable instructions for execution by a processor controlling the magnetic resonance imaging system. The magnetic resonance imaging system is operable for acquiring magnetic resonance data from the subject within an imaging zone. The magnetic resonance imaging system comprises a memory for storing a pulse sequence. The pulse sequence comprises instructions for controlling the magnetic resonance imaging system to acquire the magnetic resonance data. The pulse sequence controls the magnetic resonance imaging system to acquire the magnetic resonance data as a multiple slice acquisition performed over multiple repetition cycles.

Execution of the instructions further cause the processor to acquire a first slice group of the magnetic resonance data during a first repetition cycle using the pulse sequence. The magnetic resonance data is performed as a multiple slice acquisition so the data is divided into data that was acquired over different slices. More than one slice may be acquired as a particular time. A slice group as used herein encompasses one or more slices that are acquired simultaneously. Execution of the instructions further causes the processor to extract first central k-space data from the first slice group. Execution of the instructions further causes the processor to reconstruct first navigator data using the first central k-space data. Execution of the instructions causes the processor to repeatedly acquire a subsequent slice group of the magnetic resonance data during a subsequent repetition cycle using the pulse sequence.

Execution of the instructions further causes the processor to repeatedly extract subsequent central k-space data from the subsequent slice group. Execution of the instructions further causes the processor to repeatedly reconstruct subsequent navigator data using the subsequent central k-space data. Execution of the instructions further cause the processor to repeatedly determine a mapping from the first navigator data to the subsequent navigator data by performing a transformation between the first navigator data and the subsequent navigator data. Execution of the instructions further cause the processor to repeatedly correct the acquisition of a next slice group of magnetic resonance data using the mapping.

In another aspect the invention provides for a method of operating the magnetic resonance imaging system for acquiring magnetic resonance data from a subject within an imaging zone. The method comprises the step of acquiring a first slice group of the magnetic resonance data during a first repetition cycle using a pulse sequence wherein the pulse sequence comprises instructions for controlling the magnetic resonance imaging system to acquire the magnetic resonance data. The pulse sequence controls the magnetic resonance imaging system to acquire the magnetic resonance data as a multiple slice acquisition performed over multiple repetition cycles. The method further comprises the step of extracting first central k-space data from the first slice group.

The method further comprises the step of reconstructing the first navigator data using the first central k-space data. The method further comprises the step of repeatedly acquiring a subsequent slice group of the magnetic resonance data during a subsequent repetition cycle using the pulse sequence. The method further comprises repeatedly extracting subsequent central k-space data from the subsequent slice group. The method further comprises repeatedly reconstructing subsequent navigator data using the subsequent central k-space data. The method further comprises repeatedly determining a mapping for the first navigator data to the subsequent navigator data by performing a transformation between the first navigator data and the subsequent navigator data. The method further comprises repeatedly correcting the acquisition of a next slice group of the magnetic resonance data using the mapping.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
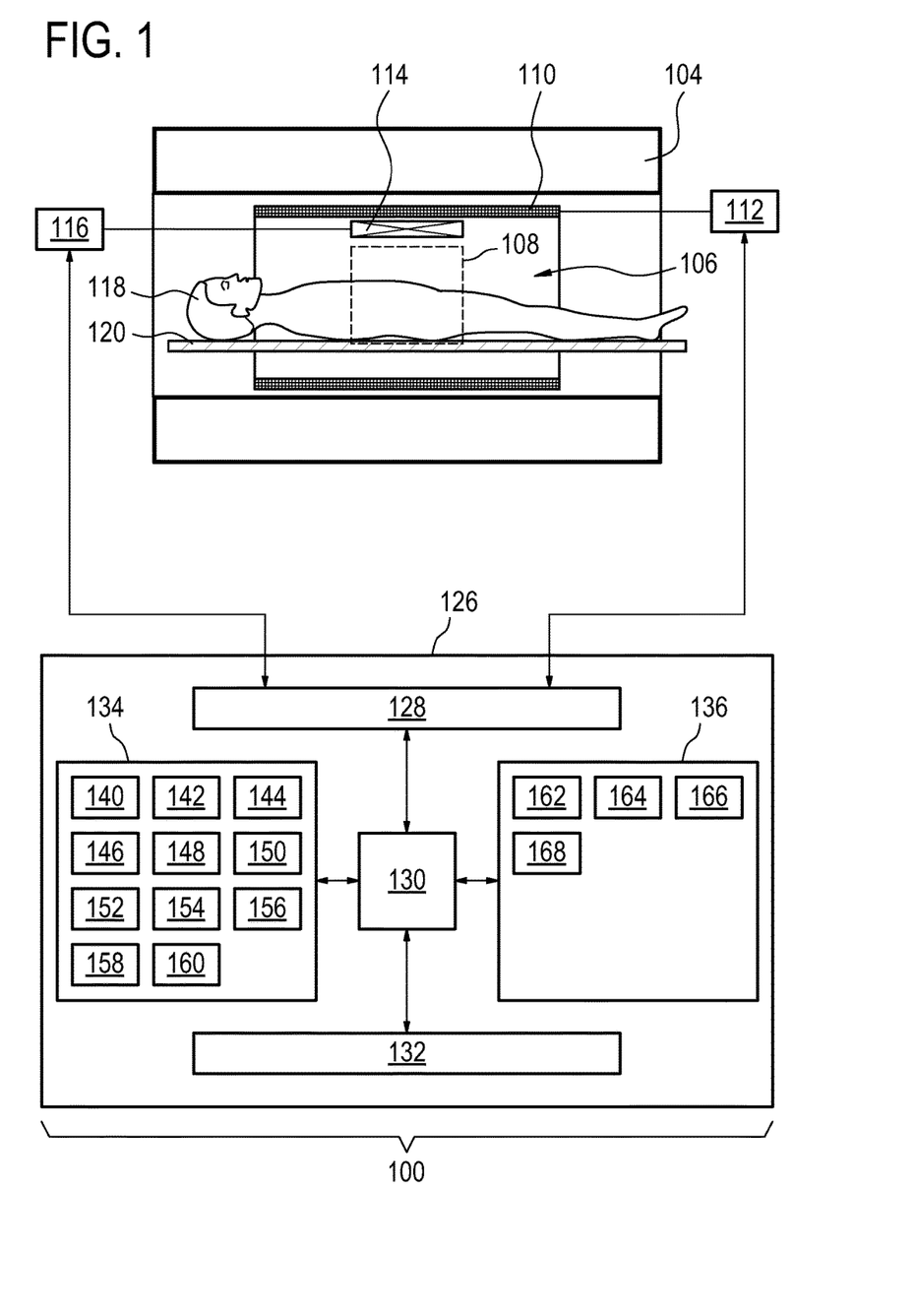
FIG. 1 illustrates an example of a magnetic resonance imaging system.

FIG. 1 shows an example of a magnetic resonance imaging system 100. The magnetic resonance imaging system 100 comprises a magnet 104. The magnet 104 is a superconducting cylindrical type magnet 104 with a bore 106 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels.

The magnetic field gradient coil power supply 112 and the transceiver 116 are connected to a hardware interface 128 of computer system 126. The computer system 126 further comprises a processor 130. The processor 130 is connected to the hardware interface 128, a user interface 132, computer storage 134, and computer memory 136.

The computer storage 134 is shown as storing or containing a pulse sequence 140. The pulse sequence is operable to provide signals or commands that the processor 130 can use to control the magnetic resonance imaging system 100 to acquire magnetic resonance data as a multiple slice acquisition performed over multiple repetition cycles. The computer storage 134 is further shown as containing a first slice group 142 of magnetic resonance data that was acquired using the pulse sequence 140. The computer storage 134 is further shown as storing some first central k-space data 144 that was extracted from the first slice group of magnetic resonance data 142. The computer storage 134 is further shown as containing first navigator data 146 that was reconstructed or built from the first central k-space 144.

The computer storage 134 is further shown as containing a subsequent slice group 148 of magnetic resonance data. The subsequent slice group 148 was acquired using the pulse sequence 140. The computer storage 134 is shown as containing subsequent central k-space data 150 that was extracted from the subsequent slice group of magnetic resonance data 148. The computer storage 134 is shown as further containing subsequent navigator data 152 that was reconstructed or built from the subsequent central k-space data 150.

The computer storage 134 is further shown as containing a mapping 154. The mapping is a mathematical translation that translates the first navigator data onto the subsequent navigator data 152. The computer storage 134 is further shown as containing scan parameter adjustments 156. The scan parameter adjustments are small adjustments or modifications to the pulse sequence 140 which enables the corrected acquisition of a next slice group of magnetic resonance data. The computer storage 134 is further shown as containing the complete magnetic resonance data 158 acquired with the pulse sequence 140. The computer storage 134 is further shown as containing the magnetic resonance image 160 which was reconstructed from the complete magnetic resonance data 158.

The computer memory 136 is shown as containing a control module 162. The control module 162 contains computer-executable code which enables the processor 130 to control the magnetic resonance imaging system 100. The control module 162 contains basic code which enables the processor 130 to do such things as use the pulse sequence 140 to acquire the magnetic resonance data 142, 148, 158. The computer memory 136 is further shown as containing an image reconstruction module 164. The image reconstruction module 164 enables the processor 130 to do such things as reconstruct the magnetic resonance image 160 from the complete magnetic resonance data 158. The image reconstruction module 164 may also enable the processor 130 to reconstruct the central k-space data 144, 150 into navigator data 146, 152 if the navigators are in image space.

The computer storage 136 is further shown as an image having an optional image processing module 166. If the two navigator data 146, 152 are in image space or images then the image processing module 166 may be used to apply standard image processing techniques to calculate the mapping 154. The computer storage 136 is shown as containing an alternative to the image processing module 166. The k-space processing module 168 contains code which enables the processor 130 to compare first navigator data 146 to subsequent navigator data 152 if they are both in k-space. If they are in k-space the k-space processing module 168 may be able to perform such things as determining a rotation and translation in k-space. This enables the k-space processing module 168 to be used by the processor 130 for calculating the mapping 154 in this case.

Figure 2:
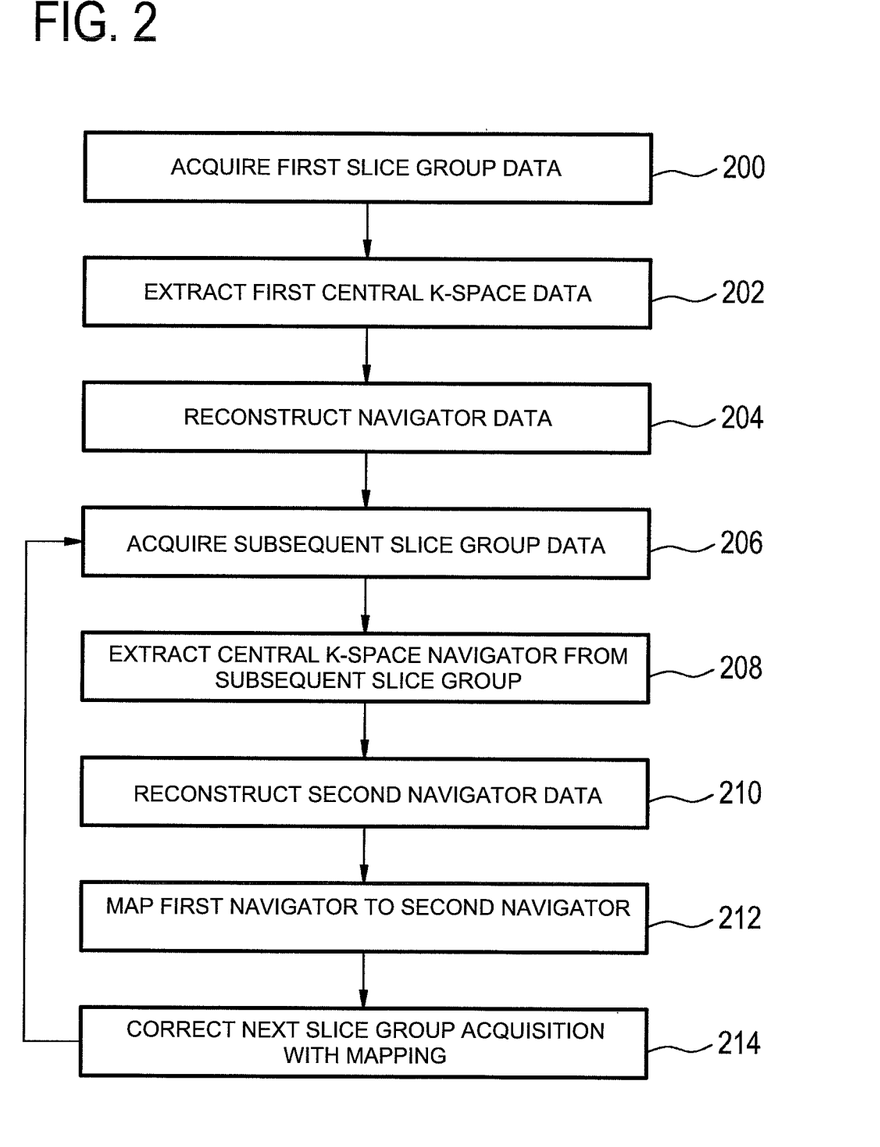
FIG. 2 shows a flow chart which illustrates an example of a method.

FIG. 2 shows a flowchart which illustrates an example of a method for operating the magnetic resonance imaging system 100 shown in FIG. 1. First in step 200 a first slice group 142 of magnetic resonance data is acquired during a first repetition cycle using a pulse sequence 140. Next in step 202 first central k-space data 144 is extracted from the first slice group. Then in step 204 first navigator data 146 is reconstructed using the first central k-space data. Next in step 206 the subsequent slice group 148 of the magnetic resonance data is acquired during a subsequent repetition cycle using the pulse sequence. Then in step 208 subsequent central k-space data 150 is extracted from the subsequent slice group. Then in step 210 subsequent navigator data 152 is reconstructed using the subsequent central k-space data.

Next in step 212 a mapping 154 is determined from the first navigator data 146 to the subsequent navigator 152 by performing a transformation between the first navigator data 146 and the subsequent navigator data 152. Then in step 214 the acquisition of a next slice group of magnetic resonance data is corrected using the mapping. It can be seen that the steps 206, 208, 210, 212, 214 are performed repeatedly. In this case the next slice group is essentially another subsequent slice group 148. This process may be repeated during the acquisition of the magnetic resonance imaging until the complete magnetic resonance data 158 is acquired.

A number of navigator based concepts for multi-slice imaging have been proposed to reduce motion artifacts (F-nav, O-nav, auto-navigation, etc.). They allow compensating for in-plane rigid body motion, but have problems to quantitatively correct also for though-plane motion. A data processing technique is discussed for multi-slice imaging which can be used in particular for PROPELLER, radial and selected spiral TSE or TFE imaging, and which allows correcting for through plane motion in addition to the in-plane motion, without acquiring an extra navigator; i.e. using this method a full 3D rigid-body prospective motion compensation is possible. Furthermore, it is proposed to extend this concept also to segmented Cartesian sampling schemes with some extra effort allowing self-navigation also for this type of acquisitions. Key to the new method is the observation that the imaging data acquired within one multi-slice interleave represent a (coarsely sampled) 3D volume or can be processed to represent this. Motion during acquisition can thus be quantified from correlating data of two subsequent multi-slice shot-intervals. This motion information can be used to reduce artifacts by correcting the scan geometry and/or rejecting data acquired during motion.

MR imaging is sensitive to motion during data acquisition. To reduce image artifacts caused by motion, various MR data acquisition and image reconstruction methods have been developed in the past. One of these techniques is PROPELLER imaging. PROPELLER imaging can be regarded as a particularly successful motion compensation method because it has a wide range of applicability.

PROPELLER imaging is a 2D imaging technique where the image data are acquired in sets of so-called "blades". One blade consists of a small set of equally spaced, parallel lines in k-space covering the k-space center. The image of one slice is reconstructed from the data of several blades which are rotated against each other such that different blades cover different parts of the outer regions of k-space. The central part of k-space is sampled by every blade.

This oversampling of the central k-space allows for in-plane motion compensation by reconstructing a low resolution image from the data of each blade and performing a registration between the images of different blades. The motion information obtained from the registration can be used either in reconstruction to compute a motion compensated image or it can be used to correct the scan geometry.

This concept is known as auto-navigation which could also be applied in radial or and special forms of spiral sampling which oversample central k-space allowing to reconstruct a low resolution image from an appropriately sampled sub-set of data, which can be used for in-plane motion estimation as in the above given propeller case.

Currently, motion compensation in PROPELLER is limited to correcting in-plane motion. Though plane motion can only be addressed qualitatively by correlating the low resolution image data information. This allows a potential identification of potentially corrupted blade data but no real correction of them due to the missing quantitative motion information. Consequently, through plane motion can still cause image artifacts even if PROPELLER imaging is used. Disclosed is a new processing method which allows full 3D rigid body motion correction, leading to improved image quality. This concept can be expanded to other sampling schemes as well.

The main idea behind the this method is based on the realization that in a typical TFE or TSE MR imaging experiment, data of several slices are acquired within one cycle (=one repetition interval) of the sequence.

The union of all data collected within one cycle allows reconstructing a kind of low resolution 3D image. This is exactly possible in Propeller multi-slice imaging, where the low resolution images that can be reconstructed for the central data of each blade cycle can be stacked in the slice direction. This stack of images forms a volume representative for the motion state frozen in this cycle.

This multi-slice volume may have gaps in the slice direction if the slices are distributed over multiple scan packages. But still, correlating volumes of subsequent TRs allows determining rigid body motion parameters in all 3D dimensions.

Figure 3:
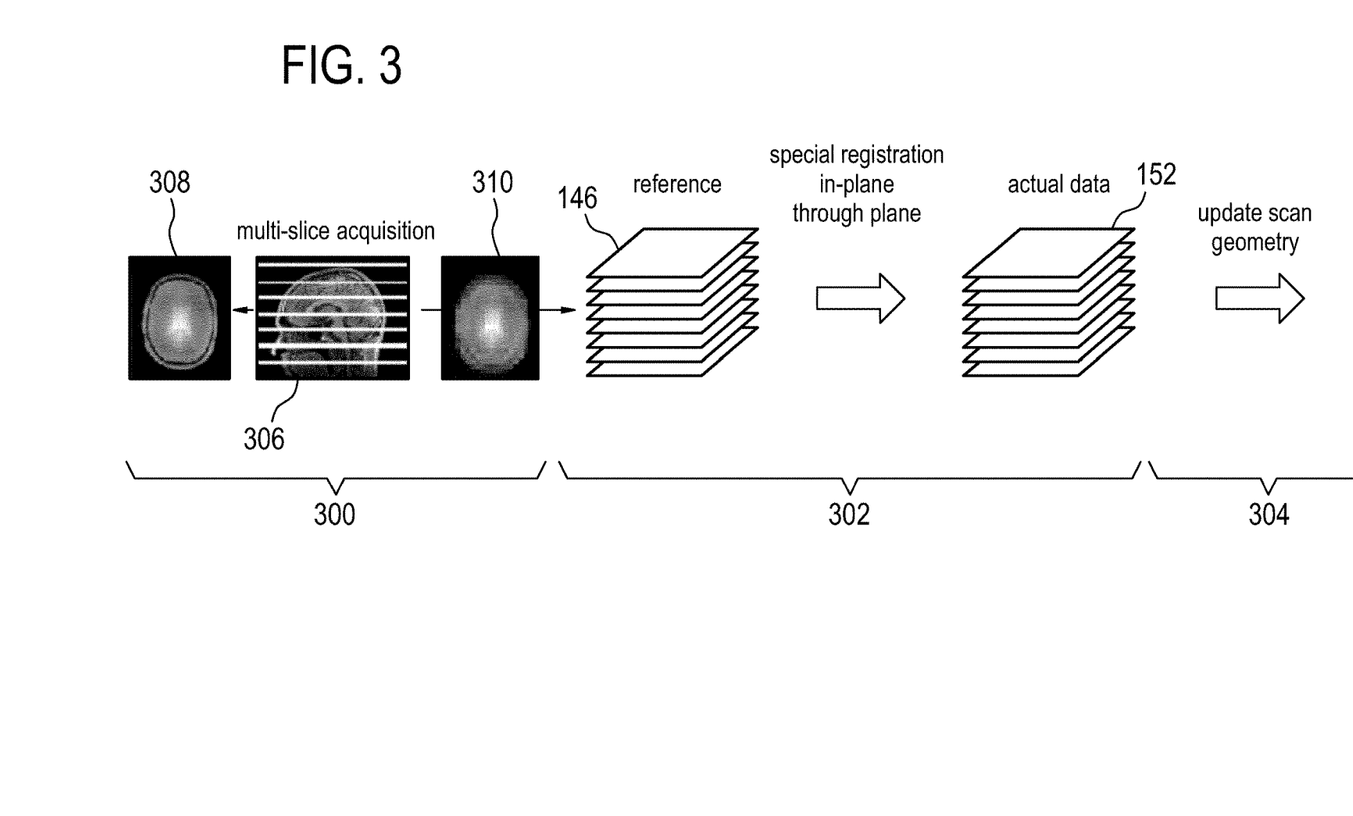
FIG. 3 shows a diagram which illustrates one example of how to correct the acquisition of a next slice group of magnetic resonance data.

FIG. 3 shows a diagram which illustrates one example of how to correct the acquisition of a next slice group of magnetic resonance data when performing a multiple slice acquisition performed over multiple repetition cycles. This example is divided into three parts. In part 300 the images are representative of magnetic resonance data acquisition 300. The next part 302 is a registration 302 or a calculation of a mapping. Finally in step 304 the scan geometry is updated using the registration calculated in part 302. Section 300 represents a multi-slice acquisition 306. From the data of each blade 308 a low resolution auto-navigator image 310 is reconstructed for each slice forming a low resolution multi-slice dataset. This is represented in step 302 as datasets 146 and datasets 152. It may also be referred to as a first navigator data 146 and subsequent navigator data 152. These sets of navigator data may either be in k-space or may be images which are reconstructed from a central k-space region. A mapping is calculated from the dataset 146 to the dataset 152. This is then used in step 304 to update the scan geometry.

This basic approach can also be applied to estimate motion in other segmented multi-slice sampling schemes. For example in multi-slice radial imaging the same approach as described in Propeller can be used, because in radial imaging the central k-space is oversampled allowing to reconstruct a low resolution image from each interleave sampled per slice in a given cycle (see FIG. 4 below for an illustration). Also for interleaved spiral multi-slice imaging such an approach is conceivable. If variable density Cartesian sampling is used, again the central part of k-space can be regridded and a low resolution image can be reconstructed enabling the same approach as described above to quantify through plane motion.

Figure 4:
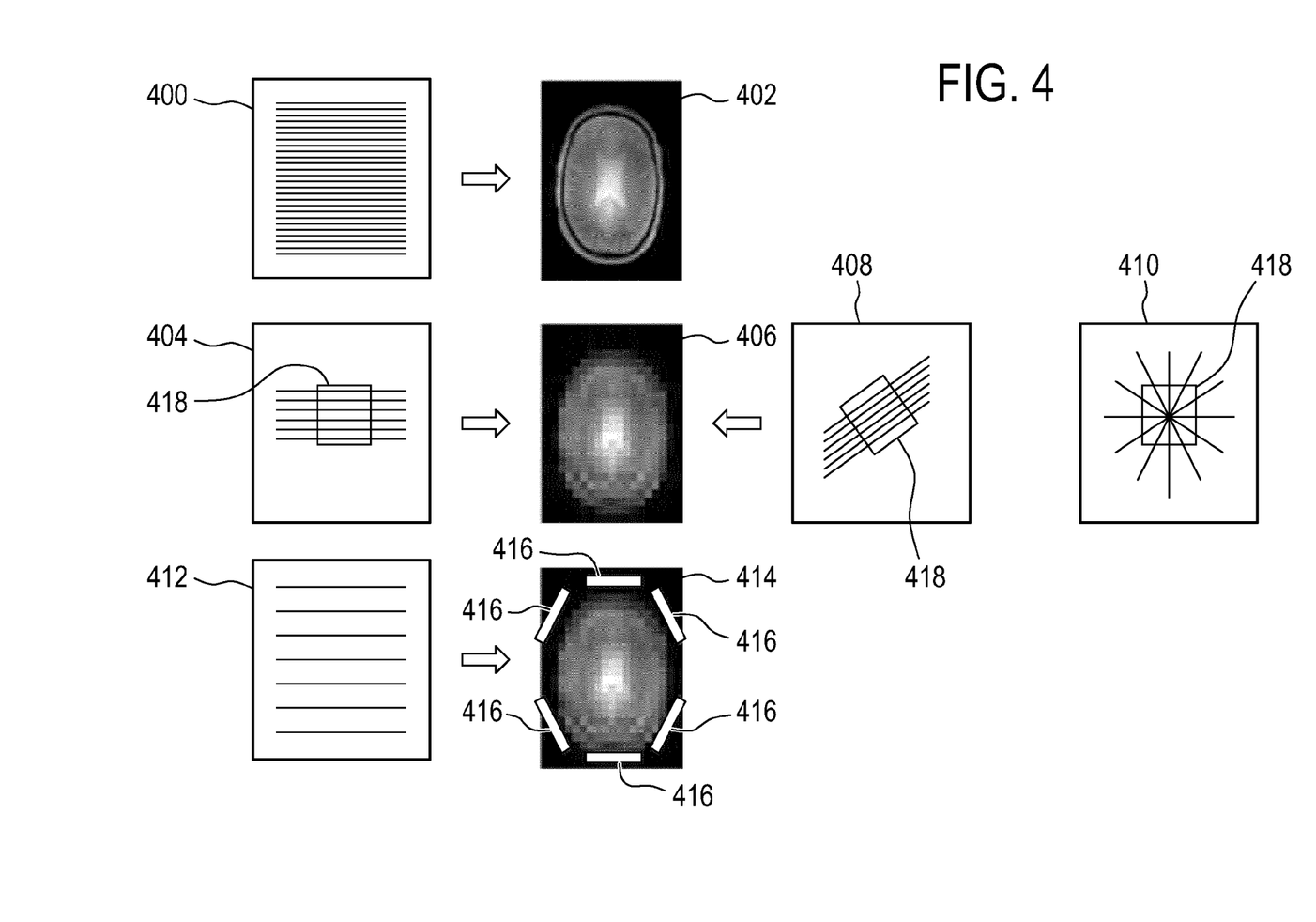
FIG. 4 illustrates a relationship between k-space data and images.

FIG. 4 illustrates the relation between k-space and images. Block 400 represents a full dataset of magnetic resonance data. This full dataset 400 may then be reconstructed into a complete magnetic resonance image 402. The block 404 represents a single propeller blade 404. This may be reconstructed into a low resolution image 406. As an alternative to this single propeller blade 404 a single propeller blade 408 at a titled angle in k-space may also be used. As another alternative to the single propeller blade 404 may also use a single radial interleave 410. The single radial interleave 410 may also facilitate low resolution image reconstruction. Block 412 shows a single Cartesian interleave which is a data subset that allows reconstructing a low resolution frame or image 414 incorporating coil sensitivity with a priori information such as image scarcity and others. Blocks labeled 416 represent the position of coil elements 416 positioned around a subject. In blocks 404, 408, and 410 there is a central k-space region 418 indicated. The central k-space region 418 may be used for constructing the first navigator data and the subsequent navigator data.

If uniform density spiral sampling is employed the individual interleave data might violate the Nyquist theorem for the target FOV, because in each interleave a smaller FOV is encoded. This is also the case in segmented Cartesian imaging. It is difficult to derive the exact full FOV information from those data due to the under-sampling effects. One way to solve the problem is using parallel imaging to unfold the image using the coil sensitivity information. This can be done for each slice individually to from the 3D low resolution volume, needed for further evaluation as described above. However, this approach can only fully remove aliasing if the sampling density in the k-space center is not lower than the maximum reduction factor supported by the receive coil geometry. I.e., this is a certain restriction for the amount of data that needs to be collected in each interleave of the sequence.

Another parallel imaging option is to use very localized receive coils and to estimate for each local coil in their restricted local FOV the rigid body motion parameters comparing two successively acquired interleaves. In this way, also for each local coil "high resolution images" could be reconstructed, which might be smoothed to cope with SNR issues and which can be concatenated to coil specific 3D stacks.

A further option is to use image sparsity properties (compressibility in a sub-space CS, regularization with prior like SENSE reference data, etc.) as additional constraints in the (iterative) reconstruction of the low resolution image. The underlying algorithms have to be tuned to be capable to reconstruct the corresponding low resolution imaging as fast as possible (see FIG. 3 for illustration).

Again a stack of those images forms a low resolution 3D volume and can be used to estimate corresponding motion parameters. This way the proposed approach can be applied also to interleaved multi-slice Cartesian imaging, using the under-sampled interleaved stacked in the third dimension for motion estimation.

The motion information or mapping may be used in two different ways to reduce motion artifacts:

1.) Correlating two 2D low resolution images of the same slice allows determining the beginning and end of a motion period. The time resolution of this motion detection is given by the shot duration, typically a few hundred milliseconds. All data collected within a detected motion period should be rejected and reacquired.

2.) Correlating two 3D volumes allows quantifying motion in 3D. The estimated motion parameters should be used to correct the scan geometry before performing reacquisitions or continuing data acquisition, respectively. The time resolution of the motion quantification is given by the duration of one TR, which is typically a few seconds, because data of all slices are required.

As an alternative to using a three-dimensional image or navigator, the k-space itself may also be used to determine a mapping in order to correct the acquisition of the next slice group. The aim is to estimate parameters for a 3D rigid body transformation in image space. It is well known how this transformation translates to k-space: A rotation in image space is also a rotation in k-space, a translation in image space is a linear phase gradient in k-space.

From this follows that, it is straightforward to estimate a rigid body transformation from 3D k-space data: Let r(k) and g(k) be the k-space data of the two navigators for which the transformation should be calculated. The rotation angle α and axis u can be determined by maximizing the correlation of the magnitude of the two navigators:

$$(\hat{u}, \hat{\alpha}) = \max_{u \in S^2, \alpha \in [-\pi, \pi]} \int d^3k (\|r(k)\| - \bar{r})(\|g(R_{u,\alpha}(k))\| - \bar{g})$$

where $\bar{r}$ and $\bar{g}$ are the average values of the magnitude.

The translation t or mapping can be estimated by e.g. finding a linear phase function that maps the phase of the (rotation corrected) second navigator to the reference:

$$\hat{t} = \min_{t \in R^3} \int d^3k \|r(k) - g(R_{\hat{u},\hat{\alpha}}(k)) \exp(2\pi i t \cdot k)\|$$

The calculations above all require 3D k-space data. To be able to apply them, a 3D k-space data set needs to be constructed from the 2D k-space data sets of a slice group. This is done in three steps:

1.) The group of 2D k-space data is transformed into a group of 2D images.

2.) The 2D images are all combined in a single 3D volume, according to the known position of each slice of the group.

3.) The 3D k-space is computed from the volume by applying a 3D Fourier-transform.

The last step yields the exact 3D k-space of the object, if the slices of the group cover the entire object without gaps. Since by definition, the k-space is the Fourier-transform of the image space.

If the group consists of fewer slices, then the last step only gives an approximation of the exact 3D k-space. To be precise: The result of step 3 is the convolution of the 3D k-space with the Fourier-transform of the sampling pattern describing which slices belong to the group. This is only an approximation of the exact 3D k-space, but it can still be good enough for an estimation of the motion transform depending on the FT of the slice sampling pattern. E.g. if the group of slices consists of every second slice, then the FT of the sampling pattern has two sharp peaks which are separated by half of the k-space size. A convolution with this function does not distort the signal distribution around the k-space center and still allows a good estimation of the motion transform.

From the above description of the calculation of the 3D k-space data, it seems that the computational effort is higher than for the image based motion estimation because the calculation of the 3D volume is only an intermediate step.

However there are situations, where the calculation in k-space can be advantageous with respect to computation time: If the imaging slices form a rectangular stack (all slices parallel, equally sized and spaced) the three steps given above can be significantly simplified because of the separability property of the Fourier-transform. In this case, the image reconstruction in step 1 is exactly inverted by the in-plane FT of step 3. I.e. it is not necessary to actually perform these computations. The only operation that needs to be performed is a 1D Fourier-transform in the slice direction for each in-plane k-space point (the third component of the 3D FT of step 3).

If the imaging slices are in this particular geometry, which is very often the case, the computation of a 3D k-space can be performed faster than the calculation of a 3D navigator volume.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS

100 magnetic resonance imaging system
104 magnet 106 bore of magnet
108 imaging zone
110 magnetic field gradient coils
112 magnetic field gradient coil power supply
114 radio-frequency coil
116 transceiver
118 subject
120 subject support
126 computer system
128 hardware interface
130 processor
132 user interface
134 computer storage
136 computer memory
140 pulse sequence
142 first slice group of magnetic resonance data
144 first central k-space
146 first navigator data
148 subsequent slice group of magnetic resonance data
150 subsequent central k-space
152 subsequent navigator data
154 mapping
156 scan parameter adjustments
158 complete magnetic resonance data
160 magnetic resonance image
162 control module
164 image reconstruction module
166 image processing module
168 k-space processing module
200 acquire a first slice group of the magnetic resonance data during a first repetition cycle using a pulse sequence
202 extract first central k-space data from the first slice group
204 reconstruct first navigator data using the first central k-space data
206 repeatedly acquire a subsequent slice group of the magnetic resonance data during a subsequent repetition cycle using the pulse sequence;
208 repeatedly extract subsequent central k-space data from the subsequent slice group
210 repeatedly reconstruct subsequent navigator data using the subsequent central k-space data
212 repeatedly determine a mapping from the first navigator data to the subsequent navigator data by performing a transformation between the first navigator data and the subsequent navigator data
214 repeatedly correct the acquisition of a next slice group of the magnetic resonance data using the rigid body transformation
300 magnetic resonance data acquisition
302 registration or calculation of mapping
304 updating of scan geometry
306 multi slice acquisition
308 full resolution
310 low resolution (central k-space data)
400 full k-space
402 image
404 propeller blade
406 image
408 propeller blade
410 single radial interleave
412 single Cartesian interleave
414 image
416 coil elements

The invention claimed is:

1. A magnetic resonance imaging system for acquiring spatially aligned magnetic resonance data from a subject within an imaging zone over a plurality of repetition cycles with correction for subject motion, wherein the magnetic resonance imaging system comprises:
a memory configured to store machine executable instructions and pulse sequence data being descriptive of a pulse sequence for controlling the magnetic resonance imaging system to acquire the magnetic resonance data, wherein the pulse sequence data controls the magnetic resonance imaging system to acquire the magnetic resonance data as a multiple slice acquisition performed over multiple repetition cycles; and
a processor for controlling the magnetic resonance imaging system, wherein execution of the instructions cause the processor to:
acquire a first slice group of the magnetic resonance data during a first repetition cycle using the pulse sequence data;
extract first central k-space data from the first slice group;
reconstruct first navigator data as a first three-dimensional navigator in image space using the first central k-space data;
wherein execution of the instructions causes the processor to repeatedly:
acquire a subsequent slice group of the magnetic resonance data during a subsequent repetition cycle using the pulse sequence data;
extract subsequent central k-space data from the subsequent slice group;
reconstruct subsequent navigator data as a subsequent three-dimensional navigator in image space using the subsequent central k-space data;
determining a mapping from the first navigator data to the subsequent navigator data by performing a three-dimensional transformation between the first navigator data and the subsequent navigator data; and
correct the acquisition of a next slice group of the magnetic resonance data using the mapping, correcting the acquisition of the next slice group including calculating scan parameter adjustments using the mapping, wherein the correction of the acquisition of the next slice group of the magnetic resonance data using the mapping is at least partially performed by modifying the acquisition of the next slice group of the magnetic resonance data with the scan parameter adjustments to spatially align the subsequent slice groups with the first slice group.

2. The magnetic resonance imaging system of claim 1, wherein the magnetic resonance data comprises multiple slices, and wherein the correction of the acquisition of the next slice group of the magnetic resonance data with the mapping corrects for in-plane rigid body motion of the subject within each of the multiple slices and for through-plane rigid body motion between the multiple slices.

3. The magnetic resonance imaging system of claim 1, wherein execution of the instructions further causes the processor to: determine if the mapping has a transformation above a predetermined deletion threshold, wherein the correction of the acquisition of the next slice group of the magnetic resonance data using the rigid body transformation is at least partially performed by deleting the subsequent slice group of the magnetic resonance data from the magnetic resonance data.

4. The magnetic resonance imaging system of claim 1, wherein execution of the instructions further causes the processor to: determine if the mapping has a transformation above a predetermined reacquisition threshold, wherein the correction of the acquisition of the next slice group of the magnetic resonance data using the rigid body transformation is at least partially performed by re-acquiring the subsequent slice group of the magnetic resonance data.

5. The magnetic resonance imaging system of claim 1, wherein the pulse sequence data is operable to cause the magnetic resonance imaging system to acquire the magnetic resonance data without a gap between the multiple slices, wherein execution of the instructions further causes the processor to reconstruct a magnetic resonance image using the magnetic resonance data and the rigid body transformation by iteratively correcting the location of the subsequent slice group of the magnetic resonance data.

6. The magnetic resonance imaging system of claim 5 further including:
a display configured to display the magnetic resonance image.

7. The magnetic resonance imaging system of claim 6, further including:
a magnetic resonance scanner including a main magnet configured to generate a main magnetic field in an imaging zone, gradient magnetic field coils configured to generate magnetic field gradients across the imaging zone, and radio frequency coils configured to induce a magnetic resonance image in the subject and to receive magnetic resonance signals from the subject, the received magnetic resonance signals including the magnetic resonance data; and
wherein the processor is further configured to control the gradient and magnetic field coils to perform a magnetic resonance imaging technique which generates and acquires the magnetic resonance data.

8. The magnetic resonance imaging system of claim 1, wherein the mapping is any one of the following: a rigid body transformation; a deformable body transformation; a rigid body transformation for a region of interest; and a rigid body transformation for the region of interest with a deformable body transformation for a surrounding region.

9. The magnetic resonance imaging system of claim 8, wherein execution of the instructions causes the processor to:
calculate a first two-dimensional image by slicing the first three-dimensional navigator image along a first plane;
calculate a subsequent two-dimensional image by slicing the subsequent three-dimensional navigator image along a second plane, wherein the location of the second plane is determined by applying the mapping to the first plane;
calculate an in-plane deformable body transformation between the first two-dimensional image and the subsequent two-dimensional image; and
reacquiring or deleting a slice portion of the subsequent slice group of the magnetic resonance data if the deformable body transformation indicates motion of the subject beyond a predetermined amount.

10. The magnetic resonance imaging system of claim 1, wherein the magnetic resonance imaging system comprises a multi-element radio frequency coil for acquiring the magnetic resonance data, wherein the pulse sequence is a parallel imaging technique, wherein execution of the instructions further causes the processor to:
receive a set of coil sensitivities for the multi-element radio frequency coil;
unfold the first three-dimensional navigator image using the set of coil sensitivities; and
unfold the subsequent three-dimensional navigator image using the set of coil sensitivities.

11. The magnetic resonance imaging system of claim 1, wherein the first navigator data is a first k-space navigator, wherein the second navigator data is a second k-space navigator.

12. The magnetic resonance imaging system of claim 1, wherein the pulse sequence data comprises commands for performing any one of the following magnetic resonance imaging techniques: PROPELLER, radial Turbo Spin Echo, selected spiral Turbo Spin Echo, and Turbo Field Echo.

13. The magnetic resonance imaging system of claim 1, wherein execution of the instructions cause the processor to replace the first navigator data with the subsequent navigator data after determining the mapping.

14. A non-transitory computer-readable medium having machine executable instructions stored thereon for execution by a processor controlling a magnetic resonance imaging system for acquiring magnetic resonance data from a subject within an imaging zone over a plurality of repetition cycles with correction for subject motion, wherein the magnetic resonance imaging system comprises a memory for storing pulse sequence data, wherein the pulse sequence data comprises instructions for controlling the magnetic resonance imaging system to acquire the magnetic resonance data, wherein the pulse sequence data controls the magnetic resonance imaging system to acquire the magnetic resonance data as a multiple slice acquisition performed over multiple repetition cycles, wherein execution of the instructions cause the processor to:
acquire a first slice group of the magnetic resonance data representing a group of parallel slices during a first repetition cycle using the pulse sequence data;
extract first central k-space data from the first slice group;
reconstruct first navigator data as a first three-dimensional navigator in image space using the first central k-space data;
wherein execution of the instructions causes the processor to repeatedly:
acquire a subsequent slice group of the magnetic resonance data during a subsequent repetition cycle using the pulse sequence data;
extract subsequent central k-space data from the subsequent slice group;
reconstruct subsequent navigator data as a subsequent three-dimensional navigator in image space using the subsequent central k-space data;
determining a mapping from the first navigator data to the subsequent navigator data by performing a three-dimensional transformation between the first navigator data and the subsequent navigator data and
correct the acquisition of a next slice group of the magnetic resonance data using the mapping by mapping scan parameters for the next slice group from the scan parameters for prior slices with the determined mapping such that the next group of slices is aligned with the prior slices.

15. A method of operating a magnetic resonance imaging system for repeatedly acquiring groups of magnetic resonance data slices from a subject within an imaging zone over a plurality of repetition cycles, wherein the method comprises the steps of:
acquiring a first slice group of the magnetic resonance data during a first repetition cycle using pulse sequence data, wherein the pulse sequence data comprises instructions for controlling the magnetic resonance imaging system to acquire the magnetic resonance data, wherein the pulse sequence data controls the magnetic resonance imaging system to acquire the magnetic resonance data as a multiple slice acquisition performed over multiple repetition cycles;

extracting first central k-space data from the first slice group;

reconstructing first navigator data as a first three-dimensional navigator in image space using the first central k-space data;

wherein the method further comprises repeatedly performing the steps of:

acquiring a subsequent slice group of the magnetic resonance data during a subsequent repetition cycle using the pulse sequence data;

extracting subsequent central k-space data from the subsequent slice group;

reconstructing subsequent navigator data as a subsequent three-dimensional navigator in image space using the subsequent central k-space data;

determining a mapping from the first navigator data to the subsequent navigator data by performing a three-dimensional transformation between the first navigator data and the subsequent navigator data;

mapping a next slice group of the magnetic resonance data using the determined mapping to translate and rotate the next slice group to correct for in-plane and through-plane motion between the acquisition of the slice groups;

reconstructing the corrected slice groups of the magnetic resonance data into a three-dimensional image; and displaying the three-dimensional image.

16. A magnetic resonance imaging system for repeatedly imaging a region of an object over multiple repetition cycles comprising:

a processor configured to:

control gradient and radio frequency coils with a pulse sequence to repeatedly acquire magnetic resonance data as a multiple slice acquisition performed over the multiple repetition cycles of the object in an imaging zone with a scan geometry;

receive a first slice group of the magnetic resonance data during a first repetition cycle;

extract first central k-space data from the first slice group;

reconstruct a first three-dimensional navigator in image space using the first central k-space data;

receive a plurality of subsequent slice groups of the magnetic resonance data during subsequent repetition cycles;

extract subsequent central k-space data from the subsequent slice groups;

reconstruct subsequent three-dimensional navigators in image space using the subsequent central k-space data;

determine a mapping from the first three-dimensional navigator to the subsequent three-dimensional navigators by performing a three-dimensional transformation between the first three-dimensional navigator and the subsequent three-dimensional navigators;

update the scan geometry of each next slice group of the subsequent slice groups using the determined mapping;

reconstruct the first and subsequent slice groups of the magnetic resonance data into a 3D image of the object in the imaging zone; and control a display to display at least a portion of the 3D image.

17. The magnetic resonance imaging system of claim 16, further including:

a magnetic resonance scanner including a main magnet configured to generate a main magnetic field in an imaging zone, gradient magnetic field coils configured to generate magnetic field gradients across the imaging zone, and radio frequency coils configured to induce a magnetic resonance image in an object and to receive magnetic resonance signals from the object, the received magnetic resonance signals including the magnetic resonance data; and wherein the processor is further configured to control the gradient and magnetic field coils to perform a magnetic resonance imaging technique with the updated scan geometry, acquire each next slice group.

18. The magnetic resonance imaging system of claim 16, further including:

the display controlled to display the at least a portion of the image.

* * * * *